(12) United States Patent
Oh et al.

(10) Patent No.: US 11,621,127 B2
(45) Date of Patent: Apr. 4, 2023

(54) METHOD OF MANUFACTURING A MULTILAYER CERAMIC CAPACITOR

(71) Applicant: SAMSUNG ELECTRO-MECHANICS CO., LTD., Suwon-si (KR)

(72) Inventors: Dong Joon Oh, Suwon-si (KR); Tae Joon Park, Suwon-si (KR); Sang Wook Lee, Suwon-si (KR); Sung Min Cho, Suwon-si (KR); Seung Mo Lim, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 0 days.

(21) Appl. No.: 17/230,427

(22) Filed: Apr. 14, 2021

(65) Prior Publication Data

US 2021/0233715 A1    Jul. 29, 2021

Related U.S. Application Data

(62) Division of application No. 15/975,198, filed on May 9, 2018, now Pat. No. 11,011,313.

(30) Foreign Application Priority Data

Jul. 11, 2017  (KR) .......................... 10-2017-0087595
Sep. 29, 2017 (KR) .......................... 10-2017-0128094

(51) Int. Cl.
*H01G 4/30* (2006.01)
*H01G 4/232* (2006.01)
(Continued)

(52) U.S. Cl.
CPC .............. *H01G 4/30* (2013.01); *H01G 4/232* (2013.01); *H01G 4/2325* (2013.01);
(Continued)

(58) Field of Classification Search
CPC ................................ H01G 4/232; H01G 4/30
See application file for complete search history.

(56) References Cited

U.S. PATENT DOCUMENTS

| 4,740,863 A | 4/1988 | Langlois |
| 4,741,077 A * | 5/1988 | Langlois ............... H01G 4/232 |
| | | 204/192.15 |

(Continued)

FOREIGN PATENT DOCUMENTS

| CN | 102683018 A | 9/2012 |
| CN | 103219150 A | 7/2013 |

(Continued)

OTHER PUBLICATIONS

U.S. Office Action dated Mar. 28, 2022, issued in corresponding U.S. Appl. No. 17/230,430.

(Continued)

*Primary Examiner* — Eric W Thomas
(74) *Attorney, Agent, or Firm* — Morgan, Lewis & Bockius LLP

(57) ABSTRACT

A multilayer ceramic capacitor includes a body having a dielectric layer and internal electrodes disposed to be alternately exposed to the third and fourth surfaces with the dielectric layer interposed therebetween. External electrodes include connection parts respectively formed on opposing surfaces of the body, band parts formed to extend from the connection parts to portions of side surfaces of the body, and corner parts in which the connection parts and the band parts are contiguous. A thickness of each of the external electrodes may be 50 nm to 2 μm. The external electrodes may be formed using a barrel-type sputtering method. A ratio t2/t1 may satisfy 0.7 to 1.2, where t1 is a thickness of each (Continued)

connection part and t2 is a thickness of each band part. A ratio t3/t1 may satisfy 0.7 to 1.0, where t3 is a thickness of each corner part.

10 Claims, 7 Drawing Sheets

(51) Int. Cl.
*H01G 4/12* (2006.01)
*H01G 13/00* (2013.01)
*C23C 14/18* (2006.01)

(52) U.S. Cl.
CPC ......... *C23C 14/185* (2013.01); *H01G 4/1227* (2013.01); *H01G 4/1245* (2013.01); *H01G 13/006* (2013.01)

(56) References Cited

U.S. PATENT DOCUMENTS

| | | | | |
|---|---|---|---|---|
| 5,251,094 | A * | 10/1993 | Amano | H01G 13/006 29/25.42 |
| 6,046,902 | A | 4/2000 | Nakagawa et al. | |
| 6,071,800 | A | 6/2000 | Shigemoto | |
| 7,161,795 | B1 | 1/2007 | Megherhi et al. | |
| 9,165,712 | B2 | 10/2015 | Jeon et al. | |
| 2006/0145401 | A1 | 7/2006 | Mihara | |
| 2012/0120547 | A1 | 5/2012 | Ro | |
| 2012/0229951 | A1 | 9/2012 | Kim | |
| 2013/0182368 | A1 | 7/2013 | Jeon et al. | |
| 2013/0182369 | A1 | 7/2013 | Jeon et al. | |
| 2013/0208401 | A1 | 8/2013 | Shirakawa et al. | |
| 2013/0258546 | A1 | 10/2013 | Kim et al. | |
| 2014/0085770 | A1 | 3/2014 | Park et al. | |
| 2015/0016013 | A1 | 1/2015 | Park et al. | |
| 2015/0022942 | A1 | 1/2015 | Chae et al. | |
| 2015/0279562 | A1 | 10/2015 | Nishisaka et al. | |
| 2015/0279567 | A1 | 10/2015 | Nishisaka et al. | |
| 2015/0380161 | A1 | 12/2015 | Lim et al. | |

FOREIGN PATENT DOCUMENTS

| | | |
|---|---|---|
| CN | 103219151 A | 7/2013 |
| CN | 104952620 A | 9/2015 |
| JP | 63-104314 A | 5/1988 |
| JP | 01-152712 A | 6/1989 |
| JP | H03-248410 A | 11/1991 |
| JP | H03-285313 A | 12/1991 |
| JP | H04-352309 A | 12/1992 |
| JP | H06-188162 A | 7/1994 |
| JP | H10-22170 A | 1/1998 |
| JP | H10-106883 A | 4/1998 |
| JP | 2000-286142 A | 10/2000 |
| JP | 2003-197992 A | 7/2003 |
| JP | 2011-216821 A | 10/2011 |
| JP | 2012-243998 A | 12/2012 |
| JP | 2013-008820 A | 1/2013 |
| JP | 2013-149939 A | 8/2013 |
| JP | 2013-165180 A | 8/2013 |
| JP | 2013-214714 A | 10/2013 |
| JP | 2005-123407 A | 5/2015 |
| JP | 2015-173292 A | 10/2015 |
| JP | 2016-009860 A | 1/2016 |
| JP | 6020502 B2 | 11/2016 |
| KR | 10-2013-0049296 A | 5/2013 |
| KR | 10-2013-0084852 A | 7/2013 |
| KR | 10-1474152 B1 | 12/2014 |
| KR | 10-2015-0117925 A | 10/2015 |
| KR | 10-2016-0001026 A | 1/2016 |

OTHER PUBLICATIONS

First Office Action issued in Chinese Patent Application No. 201810757085.6 dated Feb. 3, 2020 (with English translation).
Notice of Office Action issued in Korean Patent Application No. 10-2017-0128094, dated Jul. 28, 2018 (with English translation).
Office Action in Korean Patent Application No. 10-2017-0128094 dated Oct. 29, 2018 (with English translation).
Non-Final Office Action issued in U.S. Appl. No. 15/975,198, dated Mar. 11, 2020.
Final Office Action issued in U.S. Appl. No. 15/975,198, dated Jul. 21, 2020.
Notice of Allowance issued in U.S. Appl. No. 15/975,198, dated Apr. 14, 2021.
Japanese Office Action dated Jan. 4, 2022, issued in corresponding Japanese Patent Application No. 2018-092567 (with English translation).
Chinese Office Action dated May 6, 2022, issued in corresponding Chinese Patent Application No. 202110641858.6. (with English translation).
U.S. Office Action dated Jul. 18, 2022, issued in corresponding U.S. Appl. No. 17/230,430.
Japanese Office Action dated Feb. 7, 2023, issued in corresponding Japanese Patent Application No. 2018-092567 with English translation.

* cited by examiner

METHOD OF MANUFACTURING A MULTILAYER CERAMIC CAPACITOR

CROSS-REFERENCE TO RELATED APPLICATION

This application is a divisional of U.S. patent application Ser. No. 15/975,198 filed May 9, 2018 which claims the benefit of priority to Korean Patent Applications No. 10-2017-0087595 filed on Jul. 11, 2017 and No. 10-2017-0128094 filed on Sep. 29, 2017 in the Korean Intellectual Property Office, the disclosures of each are incorporated herein by reference in their entireties.

BACKGROUND

1. Field

The present disclosure relates to a multilayer ceramic capacitor and a method of manufacturing the same.

2. Description of Related Art

As multilayer ceramic capacitors (MLCCs) have been reduced in size and increased in capacity, the importance of increasing an effective volume ratio (i.e., a ratio of volume contributing to capacity to a total volume) of the MLCCs has increased.

In the related art, in order to form external electrodes, a method of dipping a surface of a capacitor body to which internal electrodes are exposed into a paste containing a conductive metal is commonly used.

However, the thickness of an external electrode formed by the dipping method may not be uniform, and the external electrode may be formed to be excessively thin at the corner of the body while the external electrode is formed to be excessively thick in other portions. As a result, it may be difficult to secure a high effective volume ratio. In addition, when a plating layer is formed on the external electrodes to increase connectivity and mountability of an MLCC, a plating solution may penetrate into a capacitor body, degrading reliability of the MLCC.

SUMMARY

An aspect of the present disclosure may provide a multilayer ceramic capacitor in which external electrodes are formed to be thin, uniform, and dense to increase an effective volume ratio and obtain excellent moisture tolerance reliability.

According to an aspect of the present disclosure, a multilayer ceramic capacitor may include a body and first and second external electrodes. The body has first and second surfaces opposing each other, third and fourth surfaces connected to the first and second surfaces and opposing each other, and fifth and sixth surfaces connected to the first to fourth surfaces and opposing each other, and includes a dielectric layer and internal electrodes disposed to be alternately exposed to the third and fourth surfaces with the dielectric layer interposed therebetween. The first and second external electrodes include connection parts respectively formed on the third and fourth surfaces of the body, band parts formed to extend from a respective connection part to portions of the first, second, fifth, and sixth surfaces of the body, and corner parts in which the connection parts and the band parts are contiguous. A thickness of each of the external electrodes is 50 nm to 2 μm, and when a thickness of each of the connection parts is defined as $t1$, a thickness of each of the band parts is defined as $t2$, and a thickness of each of the corner parts is defined as $t3$, $t2/t1$ satisfies 0.7 to 1.2, and $t3/t1$ satisfies 0.7 to 1.0.

According to another aspect of the present disclosure, a method of manufacturing a multilayer ceramic capacitor may include preparing a body having first and second surfaces opposing each other, third and fourth surfaces connected to the first and second surfaces and opposing each other, and fifth and sixth surfaces connected to the first to fourth surfaces and opposing each other. The body includes a dielectric layer and internal electrodes disposed to be alternately exposed to the third and fourth surfaces with the dielectric layer interposed therebetween. The method includes forming a first electrode layer on the first to sixth surfaces of the body, forming a second electrode layer on the first electrode layer, and forming a protective layer on portions of the second electrode layer on which first and second external electrodes are to be formed. The method further includes performing first etching to remove a portion of the second electrode layer that is exposed from the protective layer, and subsequently performing second etching to remove a portion of the first electrode layer that is exposed from the protective layer. The protective layer is removed following the first and second etchings.

According to a further aspect of the present disclosure, a method of manufacturing external electrodes on a multilayer ceramic capacitor includes providing a multilayer ceramic capacitor having a body with dielectric layer and internal electrodes disposed in the body to be alternately exposed to opposing end surfaces of the body with the dielectric layer interposed therebetween. First and second external electrodes are formed on external surfaces of the body of the multilayer ceramic capacitor. Each of the first and second external electrodes is formed to have a connection part covering a respective one of the opposing end surfaces of the body, and a band part formed to extend from the connection part to portions of each of four side surfaces connecting the opposing end surfaces. Each of the first and second external electrodes is formed to have a thickness of 50 nm to 2 μm, where a ratio $t2/t1$ satisfies 0.7 to 1.2 where $t1$ is a thickness of the connection part and $t2$ is a thickness of the band part.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Exemplary embodiments of the present disclosure will be described in detail with reference to the accompanying drawings.

Multilayer Ceramic Capacitor

Figure 1:
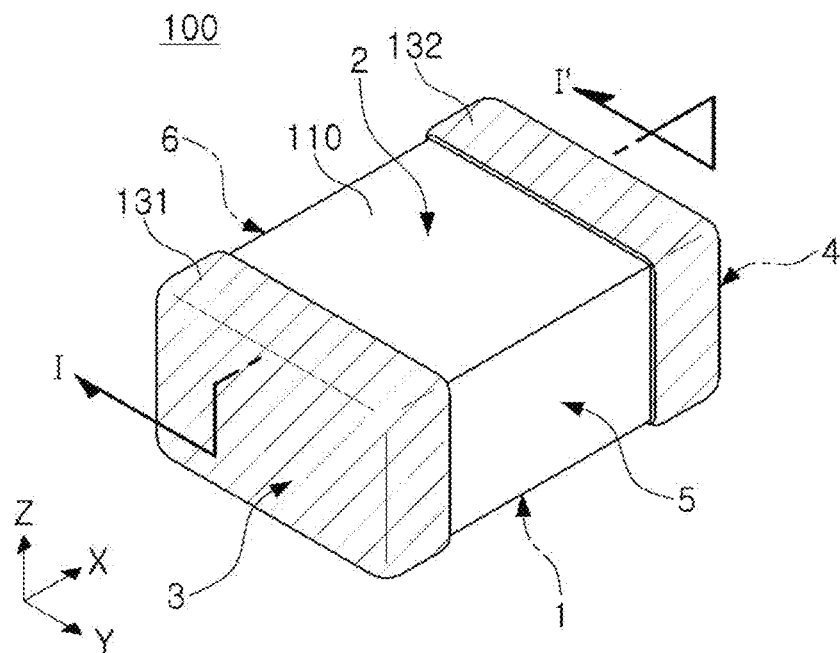
FIG. 1 is a schematic perspective view of a multilayer ceramic capacitor (MLCC) according to an exemplary embodiment.
Figure 2:
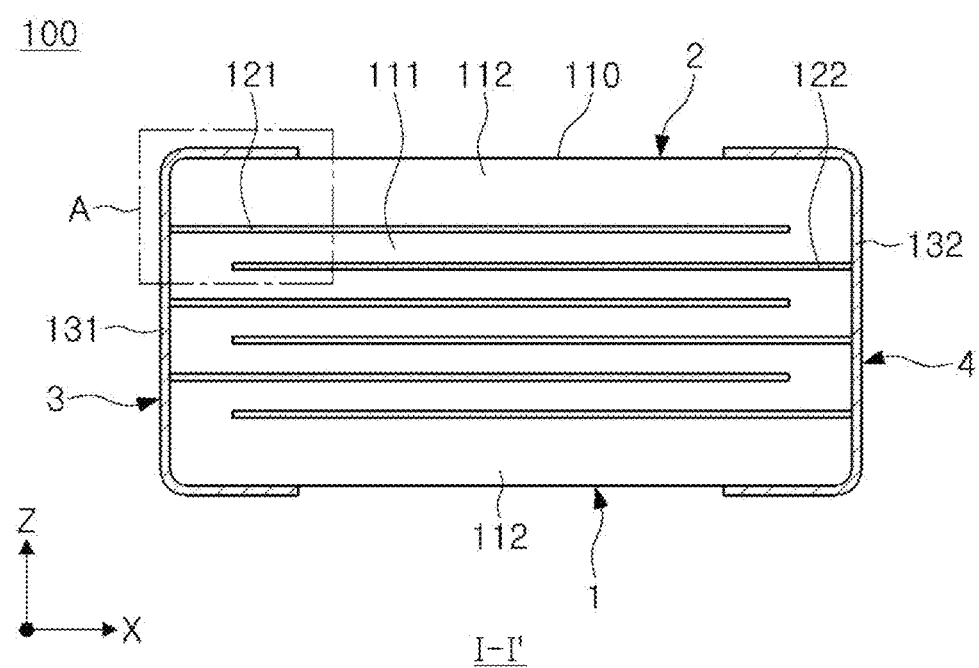
FIG. 2 is a schematic cross-sectional view of the MLCC of FIG. 1, taken along line I-I'.
Figure 3:
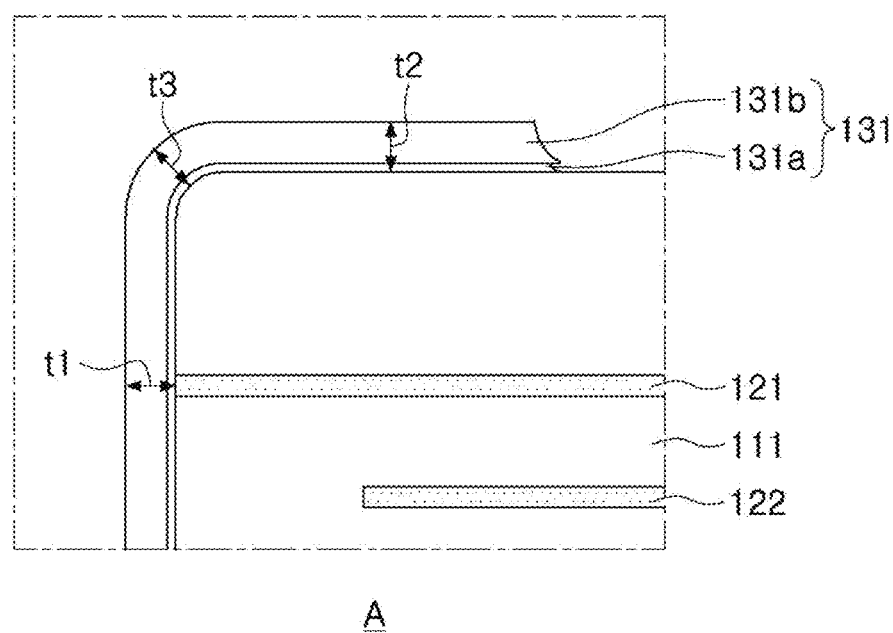
FIG. 3 is an enlarged cross-sectional view of a portion 'A' of FIG. 2.

FIG. 1 is a schematic perspective view of a multilayer ceramic capacitor (MLCC) according to an exemplary embodiment, FIG. 2 is a schematic cross-sectional view of the MLCC of FIG. 1, taken along line I-I', and FIG. 3 is an enlarged cross-sectional view of a portion 'A' of FIG. 2.

Hereinafter, an MLCC 100 according to an exemplary embodiment will be described with reference to FIGS. 1 through 3.

Referring to FIG. 1, the MLCC 100 according to an exemplary embodiment includes a body 110 and first and second external electrodes 131 and 132 disposed on outside surfaces of the body 110.

The body 110 has first and second surfaces 1 and 2 opposing each other in a thickness direction (Z direction), third and fourth surfaces 3 and 4 connected to the first and second surfaces 1 and 2 and opposing each other in a length direction (X direction), and fifth and sixth surfaces 5 and 6 connected to the first and second surfaces 1 and 2 and to the third and fourth surfaces 3 and 4 and opposing each other in a width direction (Y direction).

Referring to FIG. 2, the body 110 includes a dielectric layer 111 and internal electrodes 121 and 122 disposed to be alternately exposed to the third and fourth surfaces 3 and 4 with the dielectric layer 111 interposed therebetween.

The body 110 is formed by stacking a plurality of dielectric layers 111 in the thickness Z direction and subsequently sintering the same. A shape and dimensions of the body 110 and the amount/number of stacked dielectric layers 111 are not limited to the present exemplary embodiment.

The plurality of dielectric layers 111 constituting the body 110 are in a sintered state and adjacent dielectric layers 111 may be integrated such that boundaries therebetween may not be readily apparent without using a scanning electron microscope (SEM).

A raw material used to form the dielectric layer 111 is not limited as long as it may obtain sufficient capacitance. For example, the material may be barium titanate ($BaTiO_3$) powder. As a material used to form the dielectric layer 111, a variety of ceramic additives, organic solvents, plasticizers, binders, dispersants, and the like, may be added to the powder of the barium titanate ($BaTiO_3$), and the like, according to purposes of the present disclosure.

The internal electrodes 121 and 122 may include first internal electrode(s) 121 exposed to the third surface 3 and second internal electrode(s) 122 exposed to the fourth surface 4.

The first and second internal electrodes 121 and 122 are a pair of electrodes having opposing polarities and are electrically insulated from each other by the dielectric layer 111 disposed therebetween.

The first and second internal electrodes 121 and 122 are alternately exposed to the third and fourth surfaces 3 and 4 in the length direction (X direction) of the body 110 so as to be connected to the first and second external electrodes 131 and 132 disposed on the third and fourth outer side surfaces 3 and 4 of the body 110, respectively.

Widths of the first and second internal electrodes 121 and 122 may be determined depending on the application.

For example, the widths of the first and second internal electrodes 121 and 122 may be formed to satisfy the range of 0.2 to 1.0 μm in consideration of a size of the body 110, but the present disclosure is not limited thereto.

The first and second internal electrodes 121 and 122 may include a conductive metal such as nickel (Ni), copper (Cu), palladium (Pd), silver (Ag), lead (Pb), or platinum (Pt) alone or alloys thereof.

The body 110 may include cover layer(s) 112 formed by stacking dielectric layers without an internal electrode on the upper and lower surfaces of the body 110. The cover layer(s) 112 may serve to maintain reliability of the MLCC against an external impact.

The external electrodes 131 and 132 may include connection parts respectively formed on the third and fourth surfaces 3 and 4 of the body 110, band parts extending from the connection parts so as to be formed on portions of the first, second, fifth, and sixth surfaces 1, 2, 5, and 6 of the body, and corner parts where the connection parts and the band parts are joined or contiguous. The external electrodes 131 and 132 may be connected to the first and second internal electrodes 121 and 122, respectively.

A structure of the first and second external electrodes 131 and 132 of the MLCC according to one exemplary embodiment will be described in detail with reference to FIG. 3. FIG. 3 is an enlarged view of the first external electrode 131 but descriptions thereof may also be applied to the second external electrode 132.

In the MLCC according to one exemplary embodiment, when a thickness of the external electrode 131 is 50 nm to 2 μm, a thickness of the connection part is defined as t1, a thickness of the band part is defined as t2, and a thickness of the corner part is defined as t3, t2/t1 satisfies 0.7 to 1.2, and t3/t1 satisfies 0.7 to 1.0.

If the thickness of the external electrode is less than 50 nm, reliability of moisture resistance may deteriorate, and if the thickness exceeds 2 μm, process suitability based on the sputtering method may be lowered and the mass-productivity may be lowered.

If t2/t1 is less than 0.7 or exceeds 1.2, the thicknesses of the connection part and the band part are not uniform, degrading reliability of moisture resistance or an effective volume ratio.

If t3/t1 is less than 0.7, the corner part is too thin to act as a water penetration barrier and thus degrades moisture resistance reliability, and in order to adjust t3/t1 to exceed 1.0, separately forming an external electrode on the corner part must be added, degrading productivity.

In the related art, in order to form the external electrodes, a method of dipping surfaces of the body to which internal electrodes are exposed into a paste including a conductive metal is commonly used.

Figure 4:
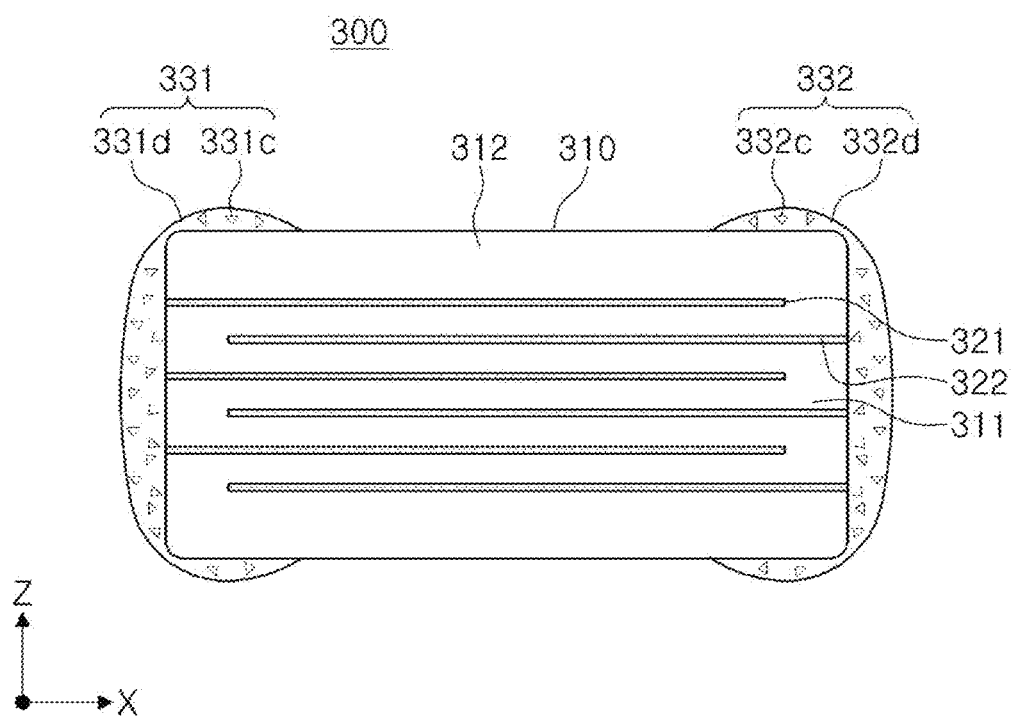
FIG. 4 is a schematic cross-sectional view of an MLCC including external electrodes formed by a dipping method.

Referring to FIG. 4, which is a cross-sectional view of a MLCC 300 including external electrodes 331 and 332 formed by the related art dipping method, it can be seen that the thickness of the external electrodes 331 and 332 formed by the dipping method using an external electrode paste is not uniform and that the external electrode is formed too thin in the corner part of the body while the external electrode is formed too thick in other portions.

As a result, it is difficult to ensure a high effective volume ratio. Additionally, in the corner part of the body (e.g., 331d, 332d), a base resin 331c/332c included in the external electrode paste may form cracks in the course of sintering after dipping, and the cracks may act as a moisture penetration path to degrade reliability of moisture resistance. Furthermore, when a plating layer is formed on the external electrodes to improve connectivity and mountability of the MLCC, a plating solution may penetrate into the body 310 to degrade reliability of the MLCC 300.

In addition, lengths of the band parts of the external electrodes are not uniform due to a mooning phenomenon that the paste rises on the surface of the capacitor.

In order to solve these problems, a method of forming external electrodes using a sputtering method may be considered.

Figure 5:
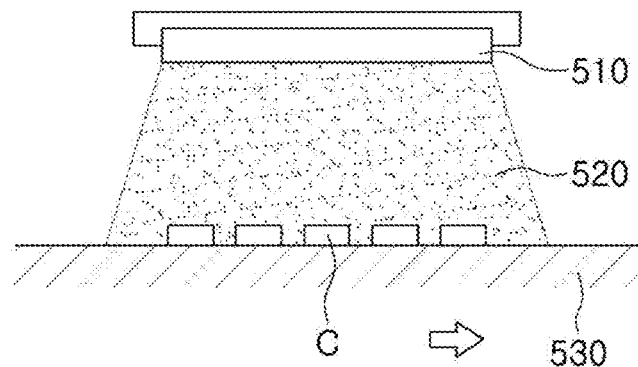
FIG. 5 is a schematic illustration of external electrodes being formed using a general sputtering method.
Figure 6:
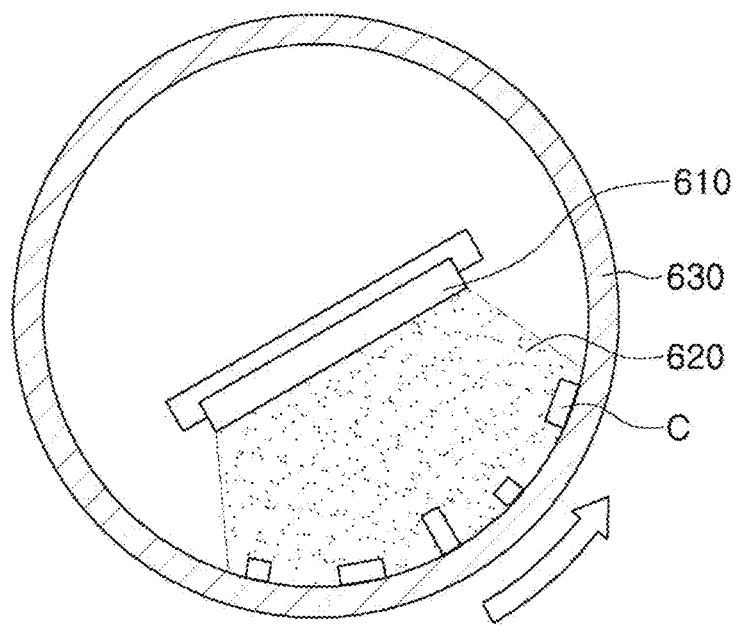
FIG. 6 is a schematic illustration of external electrodes being formed using a barrel-type sputtering method.

FIG. 5 is a view schematically illustrating a way in which external electrodes are formed using a general sputtering method, and FIG. 6 is a view schematically illustrating a way in which external electrodes are formed using a barrel-type sputtering method.

In the case of a general sputtering method 500, as illustrated in FIG. 5, a metal material 520 for an external electrode is discharged in the form of atoms or ions from a target 510 and deposited on a first surface of a body C moving in a linear direction. Thereafter, the body C is reversed and the metal material 520 for an external electrode is deposited on a second surface of the body C.

In this case, however, since the metal material 520 for an external electrode is deposited largely on the first or second surfaces of the body and less on the third and fourth surfaces of the body to form connection parts, the thickness of the connection parts may be smaller than that of the band parts. As a result, the use of the general sputtering method is difficult to satisfy 0.7 to 1.2 in t2/t1.

Meanwhile, in the case of a barrel-type sputtering method 600, as illustrated in FIG. 6, since the bodies C rotate as the barrel 630 rotates, a metal material 620 for an external electrode in the form of atoms or ions emitted from a target 610 may evenly be deposited on the entire surface of the body.

Figure 7:
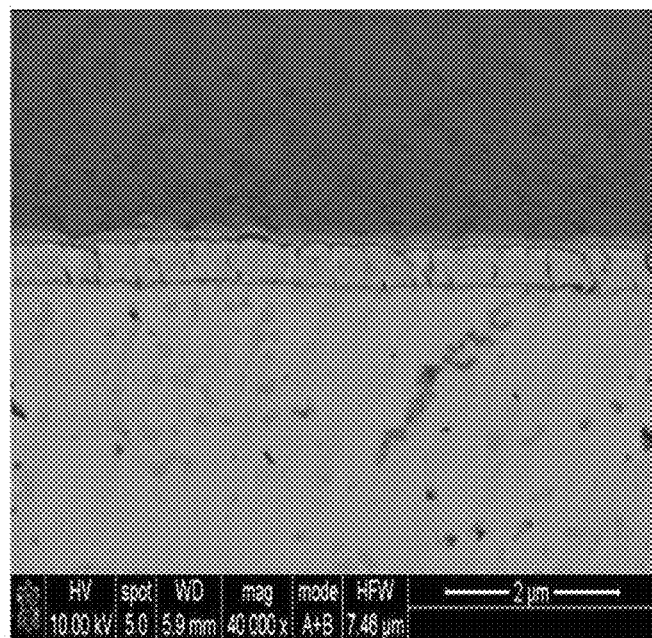
FIG. 7 is a photograph of a cross-section of a connection part of an external electrode formed using the general sputtering method of FIG. 5.
Figure 8:
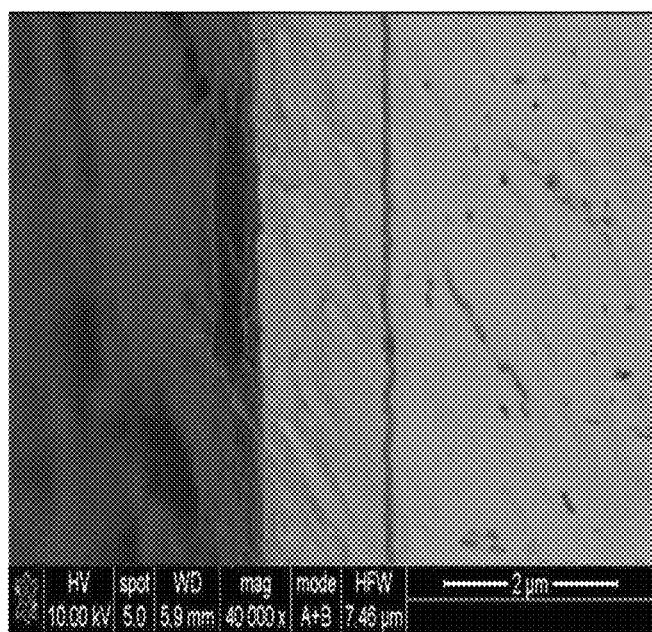
FIG. 8 is a photograph of a cross-section of a connection part of an external electrode formed using the barrel-type sputtering method of FIG. 6.

FIG. 7 is a photograph of a cross-section of a connection part of an external electrode formed using the general sputtering method of FIG. 5, and FIG. 8 is a photograph of a cross-section of a connection part of an external electrode formed using the barrel-type sputtering method of FIG. 6.

When FIGS. 7 and 8 are compared, it can be seen that the connection part of the external electrode formed using the general sputtering method is thinner than a band part and some cracks or voids are observed. In contrast, it can be seen that the connection part of the external electrode formed using the barrel-type sputtering method is observed to have few cracks or voids and is denser.

Table 1 below shows measurement of the thickness t1 of the connection part, the thickness t2 of the band part, and the thickness t3 of the corner part of the external electrode formed using the dipping method, the general sputtering method, and the barrel-type sputtering method. Here, the thickness of the external electrode formed using the dipping method is obtained by measuring a thickest portion and the thicknesses of the external electrode formed using the general sputtering method or the barrel-type sputtering method are average values.

TABLE 1

| Classification | External electrode forming method | t1 (μm) | t2 (μm) | t3 (μm) | t2/t1 | t3/t1 |
| --- | --- | --- | --- | --- | --- | --- |
| 1* | Dipping method | 20 | — | 1.5 | — | 0.075 |
| 2* | General sputtering method | 1 | 0.25 | 0.46 | 0.25 | 0.46 |
| 3 | Barrel-type sputtering method | 0.06 | 0.06 | 0.06 | 1.0 | 1.0 |
| 4 | | 0.5 | 0.4 | 0.5 | 0.8 | 1.0 |
| 5 | | 1.0 | 0.9 | 0.8 | 0.9 | 0.8 |
| 6 | | 1.7 | 1.8 | 1.6 | 1.1 | 0.9 |

As can be seen from Table 1, when the barrel-type sputtering method is used, t2/t1 satisfies 0.7 to 1.2 and t3/t1 satisfies 0.7 to 1.0.

Therefore, the external electrodes of the MLCC according to an exemplary embodiment are preferably sputtered layers, and more preferably, sputtered layers formed using the barrel-type sputtering method.

As the external electrode 131 becomes thinner, reliability of moisture resistance of the MLCC may be problematic. However, in the MLCC 100 according to an exemplary embodiment, since the external electrode 131 is a sputtered layer having density higher than that of the external electrodes 331 and 332 formed by the related art dipping method, reliability of moisture resistance may be improved. In addition, since the external electrode 131 has a very small thickness, relative to the external electrode formed by the related art dipping method, an effective volume ratio of the MLCC may be improved.

In the MLCC according to the exemplary embodiment, a thickness variation of the connection part of the external electrode may be 10% or less. In case where the thickness of the external electrode is thin such as in the present disclosure, if the thickness variation of the connection part exceeds 10%, electrical conductivity and reliability of moisture resistance or the effective volume ratio may be lowered. A thickness variation may be evaluated as one minus a ratio of a minimum thickness to a maximum thickness of a given part.

Further, a thickness variation of the band part may be 10% or less, and a length variation of the band parts may be 10% or less. In case where the thickness of the external electrode is thin such as in the present disclosure, if the thickness variation of the band part exceeds 10% or if a length variation exceeds 10%, reliability of moisture resistance or the effective volume ratio may be lowered. A length variation may be evaluated as one minus a ratio of a minimum length to a maximum length of a given part, such as a length by which the band part extends onto the first, second, fifth, or sixth surface from an edge of the third or fourth surface.

Meanwhile, the external electrode 131 may include a first electrode layer 131a in contact with the body 110 and a second electrode layer 131b formed on the first electrode layer 131a.

In order to increase electrical conductivity of the external electrode 131, the second electrode layer 131b may include at least one of copper (Cu) and aluminum (Al).

The first electrode layer 131a serves to improve adherence and adhesion between the body 110 and the second electrode layer 131b. In addition, the first electrode layer 131a may prevent metal atoms contained in the second electrode layer 131b from being spread into the internal electrode 121, improving reliability of the MLCC. To this end, the first electrode layer 131a may include at least one of Ti, Cr, NiCr, TiW, TiN, and TaN.

Here, the first electrode layer 131a may have a thickness of 10 to 100 nm.

If the thickness of the first electrode layer 131a is less than 10 nm, adhesion between the body 110 and the second electrode layer 131b may be degraded, and if the thickness of the first electrode layer 131a exceeds 100 nm, the proportion of the first electrode layer 131a to the external electrode 131 may increase to degrade electrical conductivity.

Also, as illustrated in FIG. 3, the first and second electrode layers 131a and 131b may have an undercut shape in which the ends of the band part each have a circular side wall. As described hereinafter, after the first and second electrode layers 131a and 131b are formed on the entire surface of the body, a portion of the first and second electrode layers 131a and 131b is removed by wet etching, and accordingly, the first and second electrode layers 131a and 131b may have an undercut shape in which the ends of the band part each have an isotropic side wall.

Method of Manufacturing MLCC

FIGS. 9 through 14 are perspective views schematically illustrating sequential process steps of a method of manufacturing an MLCC according to another exemplary embodiment.

A method of manufacturing an MLCC according to another exemplary embodiment includes preparing a body having first and second surfaces opposing each other in a thickness direction, third and fourth surfaces connected to the first and second surfaces and opposing each other in a length direction, and fifth and sixth surfaces connected to the first and second surfaces, connected to the third and fourth surfaces, and opposing each other in a width direction. The body includes a dielectric layer and internal electrodes disposed to be alternately exposed to the third and fourth surfaces with the dielectric layer interposed therebetween. The method includes forming a first electrode layer on the first to sixth surfaces, forming a second electrode layer on the first electrode layer, forming a protective layer on portions of the second electrode layer on which first and second external electrodes are to be formed, performing etching to remove an exposed portion of the second electrode layer and subsequently performing etching to remove an exposed portion of the first electrode layer in the body in which the protective layer is formed, and removing the protective layer.

Hereinafter, each step of the method of manufacturing an MLCC according to another exemplary embodiment will be described with reference to FIGS. 9 through 14.

Figure 9:
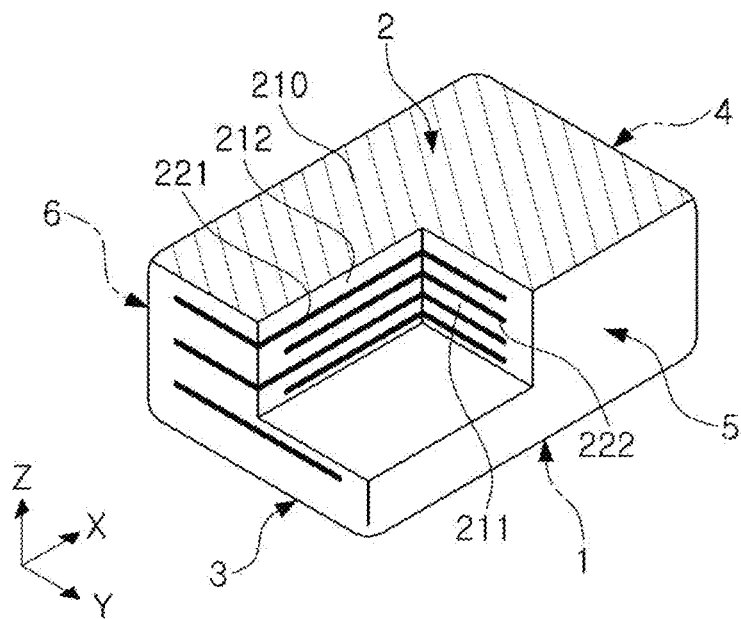
FIGS. 9 through 14 are perspective views schematically illustrating sequential process steps of a method of manufacturing an MLCC according to another exemplary embodiment.

First, referring to FIG. 9, a body 210 may be prepared to have first and second surfaces opposing each other in a thickness direction, third and fourth surfaces connected to the first and second surfaces and opposing each other in a length direction, and fifth and sixth surfaces connected to the first and second surfaces, connected to the third and fourth surfaces, and opposing each other in a width direction, and to include a dielectric layer 211 and internal electrodes 221 and 222 disposed to be alternately exposed to the third and fourth surfaces with the dielectric layer 211 interposed therebetween.

A slurry containing powder such as barium titanate (BaTiO$_3$) is applied to a carrier film and dried to prepare a plurality of ceramic sheets.

The ceramic sheet may be formed as follows. That is, ceramic powder such as barium titanate (BaTiO$_3$), a binder, a solvent, and the like, are mixed to prepare a slurry and the slurry is treated through a doctor blade method to form a sheet having a thickness of a few μm.

Next, a conductive paste containing a conductive metal may be prepared. The conductive metal may be nickel (Ni), copper (Cu), palladium (Pd), silver (Ag), lead (Pb), or platinum (Pt) alone or alloys thereof, and a conductive paste for an internal electrode including a conductive metal having an average particle size of 0.1 to 0.2 μm and containing 40 to 50 wt % may be prepared.

The conductive paste for an internal electrode may be applied to the ceramic sheet by a printing method, or the like, to form an internal electrode pattern. Here, the conductive paste may be printed by a screen printing method or a gravure printing method, but the present disclosure is not limited thereto.

The ceramic sheet on which the internal electrode pattern is printed is stacked, and ceramic sheets on which the internal electrode pattern is not printed are stacked on the upper and lower surfaces of the ceramic sheet with the printed internal electrode pattern, to form a multilayer body including the internal electrodes 221 and 222. Here, the amount of stacked ceramic sheets on which the internal electrode pattern is printed may be adjusted according to capacity of the MLCC. The ceramic sheets on which the internal electrode pattern is not printed become the cover parts 212 disposed on the upper and lower surfaces of the body 210.

Thereafter, the multilayer body may be compressed and sintered to form the body 210.

Figure 10:
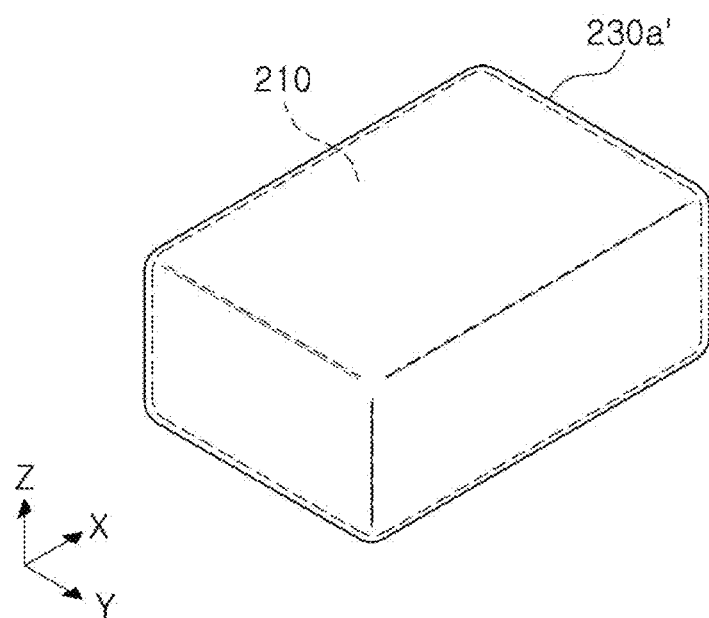
Figure 11:
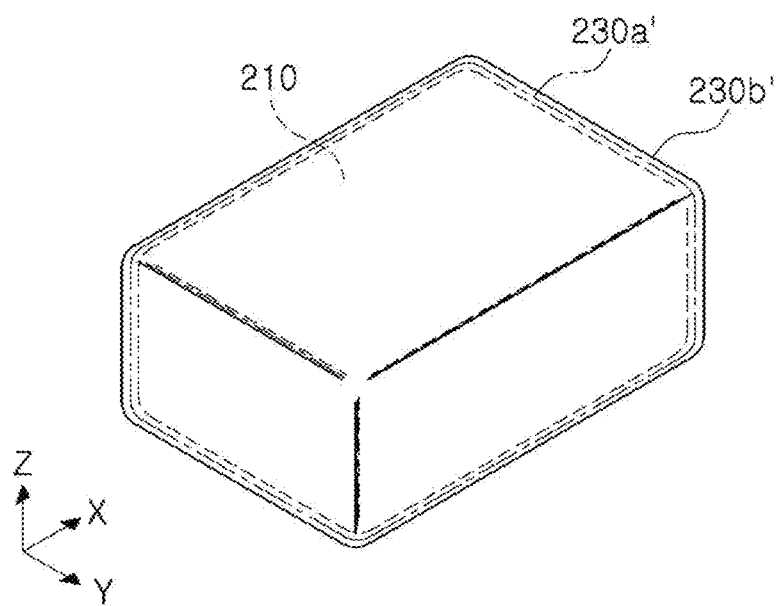

Referring to FIG. 10, after the body 210 is formed, a first electrode layer 230a' is formed on the first to sixth surfaces of the body 210. Next, referring to FIG. 11, a second electrode layer 230b' is formed on the first electrode layer 230a'.

As described above, the first and second electrode layers 230a' and 230b' are preferably formed using a sputtering method in order to make thin, uniform, and dense electrode layers. More preferably, the first and second electrode layers 230a' and 230b' are formed using the barrel-type sputtering method in order to enhance thickness uniformity of the connection part and the band part and minimize porosity.

The first electrode layer 230a' may include at least one of Ti, Cr, NiCr, TiW, TiN, and TaN and may have a thickness of 10 to 100 nm.

The second electrode layer 230b' may include at least one of Cu and Al, and the sum of the thicknesses of the first and second electrode layers 230a' and 230b' may be 50 nm to 2 μm.

Figure 12:
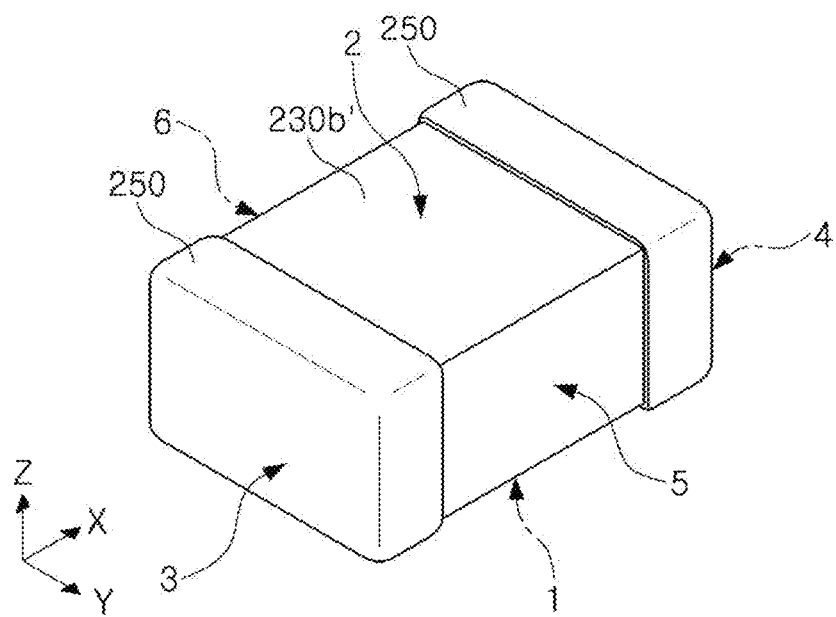

Thereafter, referring to FIG. 12, a protection layer 250 is formed on portions of the second electrode layer 230b' in which the first and second external electrodes are to be formed.

Here, the portions in which the first and second external electrodes are to be formed refer to the third and fourth surfaces 3 and 4 of the body 210 and portions (band parts) extending from the third and fourth surfaces 3 and 4 to the adjacent surfaces 1, 2, 5, and 6.

The protective layer 250 may be a polymeric resin, for example, an epoxy, an acrylic binder, or a resist but the present disclosure is not limited thereto.

Figure 13:
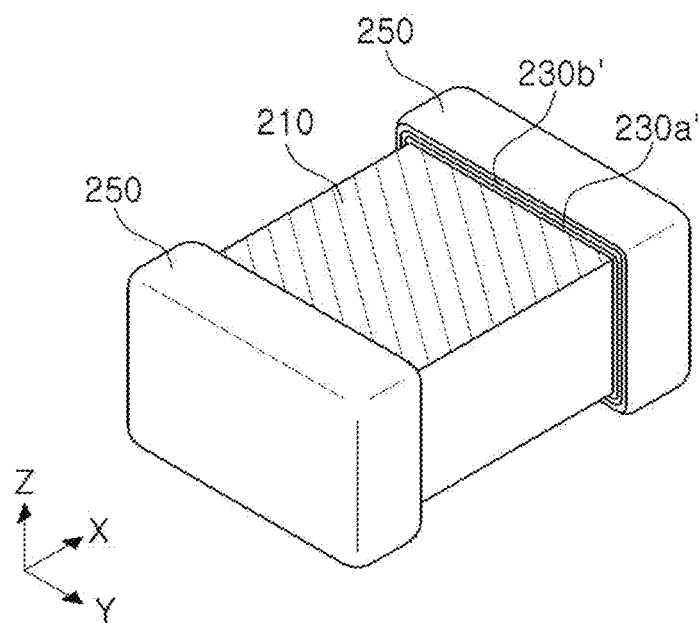

Thereafter, referring to FIG. 13, in the body 210 in which the protective layer 250 is formed, an exposed portion of the second electrode layer 230b' is etched to be removed, and thereafter, an exposed portion of the first electrode layer 230a' is etched to be removed. Since a shape of the band parts of the external electrodes is determined depending on a shape of the protective layer, a mooning phenomenon of the band parts does not occur.

The second electrode layer 230b' is exposed in a band shape at a central portion of the body 210 in a longitudinal direction by means of the protective layer 250. When the exposed second electrode layer 230b' is removed, the first electrode layer 230a' is exposed in a band shape at the central portion of the body in the longitudinal direction, and when the exposed first electrode layer 230a' is removed, the central portion of the body 210 in the longitudinal direction of the body 210 is exposed in a band shape. The first electrode layer 230a' and the second electrode layer 230b' have a very small thickness and thus are seen as a single layer, but for the clarity of explanation, the first electrode layer 230a' and the second electrode layer 230b' are illustrated to be distinguished in FIG. 13.

Here, wet etching may be performed. As portions of the first and second electrode layers are removed by wet etching, the ends of the band parts may each have an undercut shape having a circular side wall in the first and second electrode layers.

Figure 14:
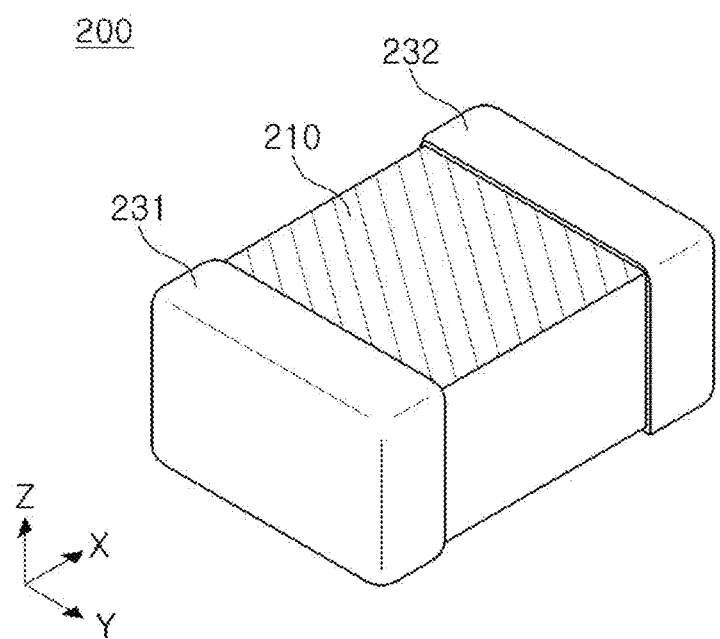

Finally, as illustrated in FIG. 14, the protective layer 250 is removed to form first and second external electrodes 231 and 232, completing the MLCC.

Thereafter, forming a plating layer on the first and second external electrodes 231 and 232 may be additionally performed as necessary but the present disclosure is not limited thereto.

The method of manufacturing an MLCC according to another exemplary embodiment is advantageous in that the external electrodes may be deposited on the end surfaces, side surfaces, and main surfaces of the body 210 at a same time without separately forming an electrode layer on the end surfaces to enhance connectivity of the internal electrodes and the external electrodes and electrode sintering is not required because a paste is not used.

As set forth above, the MLCC according to exemplary embodiments has the thin, uniform, and densely formed external electrodes, thereby improving an effective volume ratio and reliability of moisture resistance.

While exemplary embodiments have been shown and described above, it will be apparent to those skilled in the art that modifications and variations could be made without departing from the scope of the present disclosure as defined by the appended claims.

What is claimed is:

1. A method of manufacturing a multilayer ceramic capacitor, the method comprising:
preparing a body having first and second surfaces opposing each other, third and fourth surfaces connected to the first and second surfaces and opposing each other, and fifth and sixth surfaces connected to the first to fourth surfaces and opposing each other, the body including a dielectric layer and internal electrodes disposed to be alternately exposed to the third and fourth surfaces with the dielectric layer interposed therebetween;
forming a first electrode layer on the first to sixth surfaces of the body;
forming a second electrode layer on the first electrode layer;
forming a protective layer on portions of the second electrode layer on which first and second external electrodes are to be formed;
performing first wet etching to remove a portion of the second electrode layer that is exposed from the protective layer, and subsequently performing second wet etching to remove a portion of the first electrode layer that is exposed from the protective layer; and
removing the protective layer following the first and second etchings,
wherein the first electrode layer includes at least one of Cr, NiCr, TiW, TiN, or TaN, and
wherein the second electrode layer includes at least one of Cu or Al.

2. The method of claim 1, wherein
the sum of the thicknesses of the first and second electrode layers is 50 nm to μm.

3. The method of claim 1, wherein
the forming of the first and second electrode layers is performed using a barrel-type sputtering method.

4. The method of claim 1, further comprising forming a plating layer on the second electrode layer, after the removing of the protective layer.

5. The method of claim 1, wherein the forming the protective layer comprises forming the protective layer on the third and fourth surfaces of the body, and on portions of the first, second, fifth, and sixth surfaces of the body adjacent to the edges with the third and fourth surfaces of the body.

6. A method of manufacturing external electrodes on a multilayer ceramic capacitor, the method comprising:
providing a multilayer ceramic capacitor having a body with dielectric layer and internal electrodes disposed in the body to be alternately exposed to opposing end surfaces of the body with the dielectric layer interposed therebetween; and
forming first and second external electrodes on external surfaces of the body of the multilayer ceramic capacitor,
wherein each of the first and second external electrodes is formed to have a connection part covering a respective one of the opposing end surfaces of the body, and a band part formed to extend from the connection part to portions of each of four side surfaces connecting the opposing end surfaces and to include an end having an undercut shape,
wherein each of the first and second external electrodes is formed to have a thickness of 50 nm to 2 μm, where a ratio t2/t1 satisfies 0.7 to 1.2 where t1 is a thickness of the connection part and t2 is a thickness of the band part,
wherein each of the first and second external electrodes includes a first electrode layer and a second electrode layer disposed on the first electrode layer,
wherein the first electrode layer includes at least one of Cr, NiCr, TiW, TiN, or TaN, and
wherein the second electrode layer includes at least one of Cu or Al.

7. The method of claim 6, wherein the forming the first and second external electrodes comprises forming the first and second external electrodes using a barrel-type sputtering method on the external surfaces of the body of the multilayer ceramic capacitor.

8. The method of claim 6, wherein each of the first and second external electrodes is formed to further have a corner part in which the connection part and band part are contiguous, and a ratio t3/t1 satisfies 0.7 to 1.0 where t3 is a thickness of the corner part.

9. The method of claim 6, wherein the forming the first and second external electrodes comprises:

forming a first electrode layer having a first composition and a first thickness of 10 to 100 nm on external surfaces of the body of the multilayer ceramic capacitor; and forming a second electrode layer having a second composition different from the first composition, and having a second thickness such that a sum of the first and second thicknesses is 50 nm to 2 μm, on the first electrode layer.

10. The method of claim 9, wherein each of the first and second electrode layers are formed using a barrel-type sputtering method on the external surfaces of the body of the multilayer ceramic capacitor.

\* \* \* \* \*